US008940390B2

(12) United States Patent
Irie et al.

(10) Patent No.: US 8,940,390 B2
(45) Date of Patent: Jan. 27, 2015

(54) CERAMICS COMPOSITE

(75) Inventors: Masaki Irie, Kanagawa (JP); Mitsuhiro Fujita, Kanagawa (JP)

(73) Assignee: Covalent Materials Corporation, Tokyo (JP)

( * ) Notice: Subject to any disclaimer, the term of this patent is extended or adjusted under 35 U.S.C. 154(b) by 751 days.

(21) Appl. No.: 13/137,389

(22) Filed: Aug. 10, 2011

(65) Prior Publication Data

US 2012/0045634 A1  Feb. 23, 2012

(30) Foreign Application Priority Data

Aug. 18, 2010 (JP) ................................ P2010-182894
Mar. 31, 2011 (JP) ................................ P2011-081113

(51) Int. Cl.
| | | |
|---|---|---|
| C09K 11/08 | (2006.01) | |
| C04B 35/117 | (2006.01) | |
| C04B 35/115 | (2006.01) | |
| C04B 35/44 | (2006.01) | |
| C04B 35/626 | (2006.01) | |
| C09K 11/77 | (2006.01) | |
| H01L 33/50 | (2010.01) | |

(52) U.S. Cl.
CPC ............. *C04B 35/117* (2013.01); *C04B 35/115* (2013.01); *C04B 35/44* (2013.01); *C04B 35/62625* (2013.01); *C04B 35/62655* (2013.01); *C09K 11/7774* (2013.01); *C04B 2235/3225* (2013.01); *C04B 2235/3229* (2013.01); *C04B 2235/5445* (2013.01); *C04B 2235/602* (2013.01); *C04B 2235/604* (2013.01); *C04B 2235/6581* (2013.01); *C04B 2235/77* (2013.01); *C04B 2235/9653* (2013.01); *C04B 2235/9661* (2013.01); *H01L 33/50* (2013.01)
USPC ..................... 428/220; 252/301.4 R; 313/504

(58) Field of Classification Search
CPC   C04B 35/115; C04B 35/44; C04B 35/62625; C04B 35/62655; C04B 35/117
USPC ....... 428/220; 252/301.4 R, 301.4 F; 313/503
See application file for complete search history.

(56) References Cited

U.S. PATENT DOCUMENTS

| | | | |
|---|---|---|---|
| 7,879,258 B2 | 2/2011 | De Graaf et al. | |
| 2008/0149956 A1* | 6/2008 | Mueller-Mach et al. | ........ 257/98 |
| 2008/0187746 A1* | 8/2008 | De Graaf et al. | ............. 428/332 |
| 2011/0181173 A1 | 7/2011 | De Graaf et al. | |

FOREIGN PATENT DOCUMENTS

| | | |
|---|---|---|
| JP | 2007-161944 (A) | 6/2007 |
| JP | 2008-533270 (A) | 8/2008 |
| WO | WO 2006/097876 (A1) | 9/2006 |

* cited by examiner

*Primary Examiner* — Maria Veronica Ewald
*Assistant Examiner* — Laura Auer
(74) *Attorney, Agent, or Firm* — McGinn IP Law Group, PLLC

(57) ABSTRACT

The present invention relates to a ceramics composite including an inorganic material which includes: a matrix phase including a translucent ceramics; and a phosphor phase including YAG containing Ce, in which a content of the phosphor phase is from 22% by volume to 55% by volume based on the whole phase including the matrix phase and the phosphor phase, a content of Ce in the YAG is 0.005 to 0.05 in terms of an atomic ratio of Ce to Y (Ce/Y), and the ceramics composite has a thickness in a light outgoing direction of 30 µm to 200 µm.

10 Claims, 2 Drawing Sheets

US 8,940,390 B2

CERAMICS COMPOSITE

FIELD OF THE INVENTION

The present invention relates to a ceramics composite for wavelength conversion for use in white LED (Light Emitting Diode) and the like.

BACKGROUND OF THE INVENTION

At present, in white LED, the mainstream is a method where a composite for wavelength conversion composed of a resin and a phosphor is provided on a light emitting element and a blue light emitted from the light emitting element and a yellow light obtained by wavelength conversion of a part of the blue light through applying the blue light to the phosphor are mixed in the composite to obtain a white light.

However, the resin constituting the composite tends to deteriorate gradually by light or heat generated from the light emitting element and thus there is a problem that properties such as durability, heat resistance, and emission intensity decrease.

Therefore, there have been performed studies each using a ceramics composite consisting of an inorganic material with no resin as a composite for wavelength conversion.

For example, Patent Document 1 discloses a massive phosphor consisting of an inorganic material and having a surface roughness (Ra) of 0.05 to 3 μm, in which the inorganic material is composed of crystallized glass, and the crystallized glass is obtained by precipitating YAG crystals or a YAG crystal solid solution containing $Ce^{3+}$.

Moreover, Patent Document 2 discloses a phosphor having a polycrystalline ceramics structure including a phosphor of doped YAG type, in which the phosphor is embedded in a ceramics matrix containing non-luminescent polycrystalline alumina, the ceramics matrix includes 80 to 99.99 vol. % of alumina and 0.01 to 20 vol. % of the phosphor, and the phosphor has the composition $(Lu_{1-x-y-a-b}Y_x Gd_y)_3(Al_{1-z}Ga_z)_5 O_{12}:Ce_a Pr_b$ where $0<x \leq 1$; $0 \leq y<1$; $0 \leq z \leq 0.1$; $0 \leq a \leq 0.2$ and $0 \leq b \leq 0.1$, and $a+b>0$.

Patent Document 1: JP-A-2007-161944
Patent Document 2: JP-T-2008-533270

SUMMARY OF THE INVENTION

However, although the massive phosphor described in Patent Document 1 is excellent in heat resistance, light resistance, and weather resistance and can suppress deterioration of the emission intensity and shortening of the life of a device such as a light emitting diode caused by deterioration of the conventional resin, a further improvement is necessary in order to improve the properties such as the emission intensity as a phosphor of an inorganic material. Moreover, since the inorganic material described in Patent Document 1 is mainly constituted by a crystallized glass, there is a case where heat conductivity as a phosphor is low and there is a limit for extending the life of a light emitting diode or the like.

Moreover, an object of the phosphor described in Patent Document 2 is to obtain a light emitting element which alleviates a light loss due to back scattering and the problem of a low heat conductivity due to the use of a silicone and/or an epoxy resin. However, as in the case of Patent Document 1, a further improvement is also necessary in order to further improve the emission intensity and heat conductivity as a phosphor of an inorganic material.

The present invention is contrived in consideration of the aforementioned situations, and an object of the invention is to provide a ceramics composite for wavelength conversion, which can achieve further improvement of the emission intensity and heat conductivity as a ceramics composite and can achieve extension of the life of a light emitting diode using the same.

Namely, the present invention relates to the following items 1 to 3.

1. A ceramics composite including an inorganic material which includes:
    a matrix phase including a translucent ceramics; and
    a phosphor phase including YAG containing Ce,
    in which a content of the phosphor phase is from 22% by volume to 55% by volume based on the whole phase including the matrix phase and the phosphor phase,
    a content of Ce in the YAG is 0.005 to 0.05 in terms of an atomic ratio of Ce to Y (Ce/Y), and
    the ceramics composite has a thickness in a light outgoing direction of 30 μm to 200 μm.

2. The ceramics composite according to item 1, in which the content of Ce in the YAG is 0.005 to 0.035 in terms of the atomic ratio of Ce to Y (Ce/Y).

3. The ceramics composite according to item 1 or 2, which has an emission peak wavelength of 551 nm to 580 nm at the time when a blue light enters into the ceramics composite.

According to the invention, there is provided a ceramics composite for wavelength conversion, which can achieve further improvement of the emission intensity and heat conductivity as a ceramics composite and can achieve extension of the life of a light emitting diode using the same.

DETAILED DESCRIPTION OF THE INVENTION

The following will describe the ceramics composite according to the invention in detail with reference to Embodiments and Examples.

Figure 1:
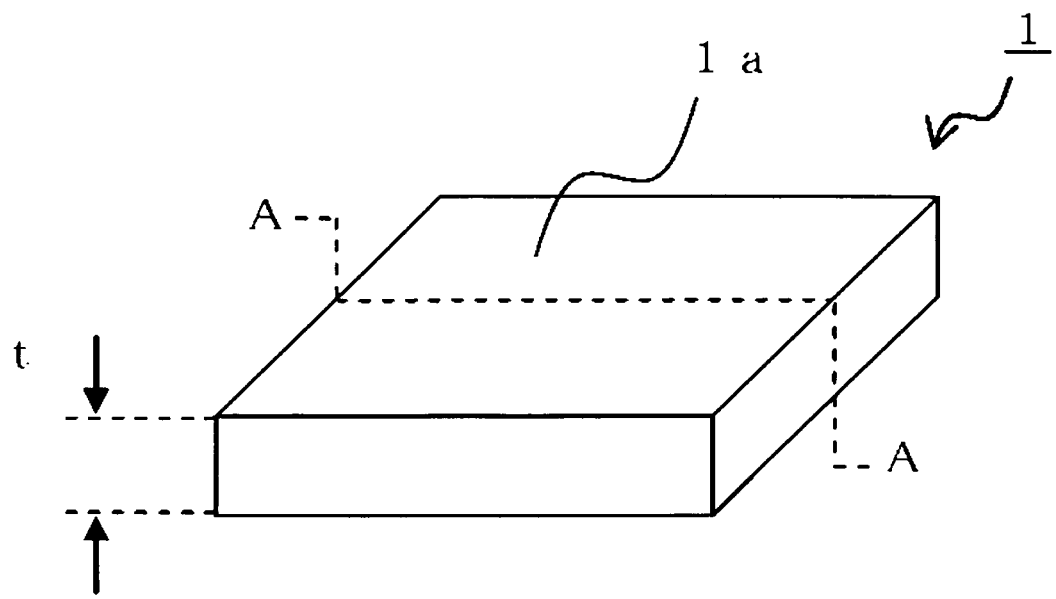
FIG. 1 is a schematic view showing one example of an appearance of a phosphor according an embodiment of the invention.
Figure 2:
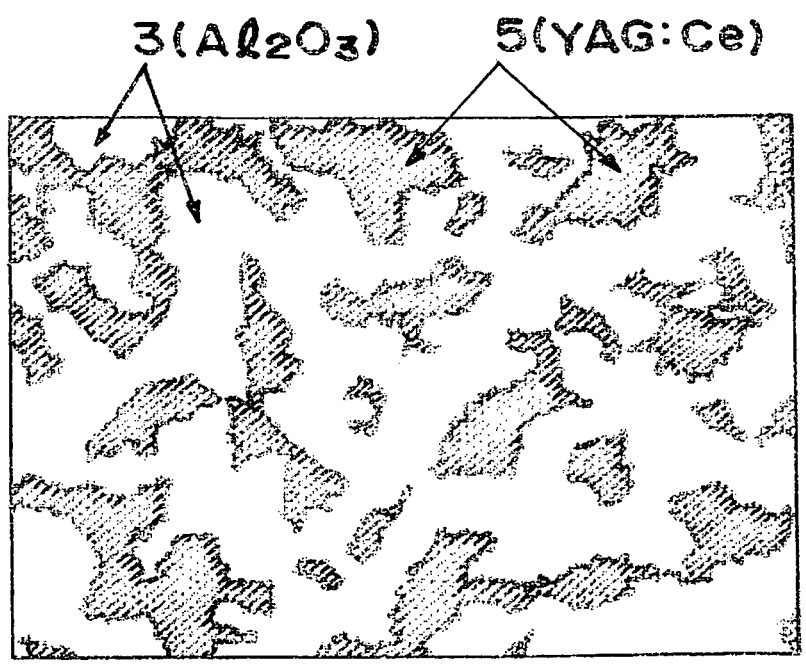
FIG. 2 is a schematic view showing the cross-section when the phosphor shown in FIG. 1 is cut at the A-A line.

FIG. 1 is a schematic view showing one example of an appearance of a phosphor according an embodiment of the invention and FIG. 2 is a schematic view in the cross-section when the phosphor shown in FIG. 1 is cut at the A-A line. As shown in FIGS. 1 and 2, the ceramics composite according to the invention includes, for example, a plate-like material and is a ceramics composite 1 including an inorganic material having a matrix phase 3 including $Al_2O_3$ and a phosphor phase 5 including YAG containing Ce, in which the content of the phosphor phase is 22% by volume to 55% by volume based on the whole phase including the matrix phase and the phosphor phase, the content of Ce in the YAG is 0.005 to 0.05 in terms of an atomic ratio of Ce to Y (Ce/Y), and the ceramics composite has the thickness in a light outgoing direction of 30 μm to 200 μm.

Since the ceramics composite of the invention possesses the constitution as mentioned above, further improvement of the emission intensity and heat conductivity as a ceramics composite can be achieved and also extension of the life of the light emitting diode using the same can be achieved.

As the matrix phase in the present embodiment, $Al_2O_3$ is mentioned but, as the matrix phase 3 including a translucent ceramics, $MgAl_2O_4$, $Y_2O_3$, MgO, or the like can be used. Of these, in view of improvement of the emission intensity, the use of $Al_2O_3$ as the matrix phase is further preferred.

In this regard, the translucent ceramics means ceramics capable of transmitting fluorescence generated by the phosphor phase.

The content of the phosphor phase 5 is 22% by volume to 55% by volume based on the whole phase including the matrix phase and the phosphor phase.

When the content thereof is less than 22% by volume, it is necessary to increase the thickness t of the ceramics composite 1 in a light outgoing direction in order to obtain a white light. However, in this case, since the thickness t is large, the fluorescent component leaks to a lateral side of the ceramics composite 1 and color unevenness occurs, so that the case is not preferred.

Moreover, even in the case where a white light is obtained without increasing the thickness t in the light outgoing direction, since the content of the phosphor phase 5 is small, a wavelength-converted yellow light decreases and the distance for mixing a blue light and the yellow light in the composite decreases, so that the color unevenness is prone to occur and thus the case is not preferred. In the case where the content thereof exceeds 55% by volume, heat conductivity decreases and life limit shortens, so that the case is not preferred.

Moreover, the content of Ce in the YAG is preferably 0.005 to 0.05 in terms of an atomic ratio Ce to Y (Ce/Y). In the case where the content of Ce in the YAG is less than 0.005 in terms of the atomic ratio (Ce/Y), since the degree of wavelength conversion by Ce is little, a bluish white light (an emission peak wavelength of less than 545 nm) is formed and thus a desirable wavelength (an emission peak wavelength of 545 nm to less than 580 nm) of a white light cannot be obtained, so that the case is not preferred. In the case where the atomic ratio (Ce/Y) exceeds 0.05, since the content of Ce increases, Ce which cannot dissolve in YAG segregates, whereby the emission intensity decreases, so that the case is not preferred.

The thickness of the ceramics composite 1 in a light outgoing direction is 30 μm to 200 μm.

In the case where the thickness t is less than 30 μm, there is a concern that cracks and the like occur at the LED production due to exceedingly thin thickness t and also it becomes difficult to form a self-standing one, so that the case is not preferred. In the case where the thickness t exceeds 200 μm, as mentioned above, the fluorescent component leaks to a lateral side of the ceramics composite 1 due to the large thickness t of the ceramics composite and the color unevenness occurs, so that the case is not preferred.

The content of Ce in the YAG is preferably 0.005 to 0.035 in terms of an atomic ratio of Ce to Y (Ce/Y).

By controlling the atomic ratio (Ce/Y) to such a range, a ceramics composite for wavelength conversion having a higher emission intensity can be obtained.

In the ceramics composite according to the invention, an emission peak wavelength of a light emitted from a light outgoing surface of the ceramics composite 1 (upper surface 1a of the ceramics composite 1 in FIG. 1) at the time when a blue light (preferably a light having an emission peak wavelength of 445 nm to 475 nm (473 nm in Examples)) enters into the ceramics composite 1 from an light emitting element or the like is preferably 551 nm to 580 nm. The emission peak wavelength herein means a wavelength at which the emission intensity by the ceramics composite is high among the wave profile of an emission spectrum.

Since the ceramics composite according to the invention possesses such optical properties, a reliable white light can be obtained.

It is preferred that the particle size of YAG particles containing Ce constituting the phosphor phase is 0.5 μm to 10.0 μm and the surface roughness (Ra) on the light outgoing surface of the ceramics composite is 0.1 μm to 1.0 μm. By such a constitution, properties such as the emission intensity and life as a white phosphor using YAG:Ce as a material can be further improved.

When the particle size of the YAG particles containing Ce constituting the phosphor phase is smaller than 0.5 μm, crystallinity of the YAG particles is low and thus there is a concern that the emission intensity decreases. On the other hand, when the particle size thereof is larger than 10.0 μm, an emission distribution in the fluorescent layer occurs, whereby there is a concern that the color unevenness occurs.

In this regard, the particle size herein indicates an average crystal particle size calculated by an intercept method. Namely, after a part of a measurement sample is mirror-polished, it is subjected to thermal etching in the air at 1500° C. for 3 hours, then the microstructure is observed on an optical microscope, and the average crystal particle size is calculated by the intercept method.

When the surface roughness (Ra) on the light outgoing surface of the ceramics composite is smaller than 0.1 μm, a ratio of the light totally reflected at the light outgoing surface increases, so that there is a concern that an extraction efficiency decreases and hence the emission intensity decreases. On the other hand, when the surface roughness (Ra) thereof is larger than 1.0 μm, not only mechanical strength decreases but also there is a concern that the color unevenness occurs.

In this regard, the surface roughness (Ra) herein is one measured using a surface shape roughness measuring instrument FORM TARYSURF PGI830 manufactured by Taylor Hobson Ltd. based on JIS B 0601-2001.

Incidentally, with regard to the aforementioned content, mixing of unavoidable impurity ingredients contained in the inorganic material is not excluded but it is more preferred to control the total amount of metal impurities such as Fe and Cr to 100 ppm or less. Thereby, the decrease in the emission intensity and the occurrence of the color unevenness can be further suppressed and also the control of the emission peak wavelength becomes easier, so that the above control is preferred.

EXAMPLES

The following will describe the invention in further detail based on Examples but the invention should not be construed as being limited to the following Examples.

(Test 1)

A cerium oxide powder having an average particle size of 0.3 μm and a purity of 99.9%, an yttrium oxide powder having an average particle size of 0.9 μm and a purity of 99.9%, an aluminum oxide powder having an average particle size of 0.3 μm and a purity of 99.9%, ethanol, and an acrylic binder were weighed in a prescribed ratio, added, and mixed in a ball mill using aluminum oxide balls for 20 hours. From the resulting slurry, a granulation powder having an average particle size of 50 μm was prepared using a spray drier. On this occasion, by regulating the amounts of the cerium oxide power, the yttrium oxide powder, and the aluminum oxide powder, a plurality of the granulation powders each having an average particle size of 50 μm and being different in the YAG:Ce content and the Ce/Y atomic ratio in the ceramics composite were prepared.

Then, each of the prepared granulation powders was subjected to uniaxial molding at 10 MPa and cold isostatic press (CIP) at 100 MPa to form a formed article. After degreased at 600° C. in the air, the resulting formed article was sintered under a vacuum atmosphere (YAG:Ce/$Al_2O_3$).

After bulk density (JIS C 2141) was measured by Archimedes method for the resulting sintered article, a part thereof was pulverized and true density was measured by a dry automatic densimeter (Accupyc 1330 manufactured by Shimadzu Corporation). Moreover, after a part thereof was washed, Y, Al, and Ce concentration was measured by ICP emission spectrochemical analysis. Furthermore, for a part thereof, the crystalline phase was investigated by powder X-ray diffraction. Based on the measurement results of the density, Y concentration, Al concentration, and Ce concentration of the sintered article and the crystalline phase, the YAG:Ce content in the composite and $Al_2O_3$ in the matrix phase were calculated. On this occasion, the density of YAG:Ce and the density of $Al_2O_3$ were used for the calculation as 4.55 g/$cm^3$ and 3.99 g/$cm^3$, respectively.

Table 1 shows the Ce/Y atomic ratio according to the present test, the content of the phosphor phase (YAG:Ce) (ratio by volume) in the ceramics composite, the content of $Al_2O_3$ (ratio by volume) in the matrix phase, and results of measuring heat conductivity by laser flash method after a part of the resulting sintered article was processed into a size of ϕ10×2 mm.

A target of heat conductivity was 18 W/(m·k) or more in view of a heat radiation effect, and the case of 20 W/(m·k) or more was regarded as "Good", the case of 18 W/(m·k) to less than 20 W/(m·k) was regarded as "Fair", and the case of less than 18 W/(m·k) was regarded as "Poor".

Figure 3:
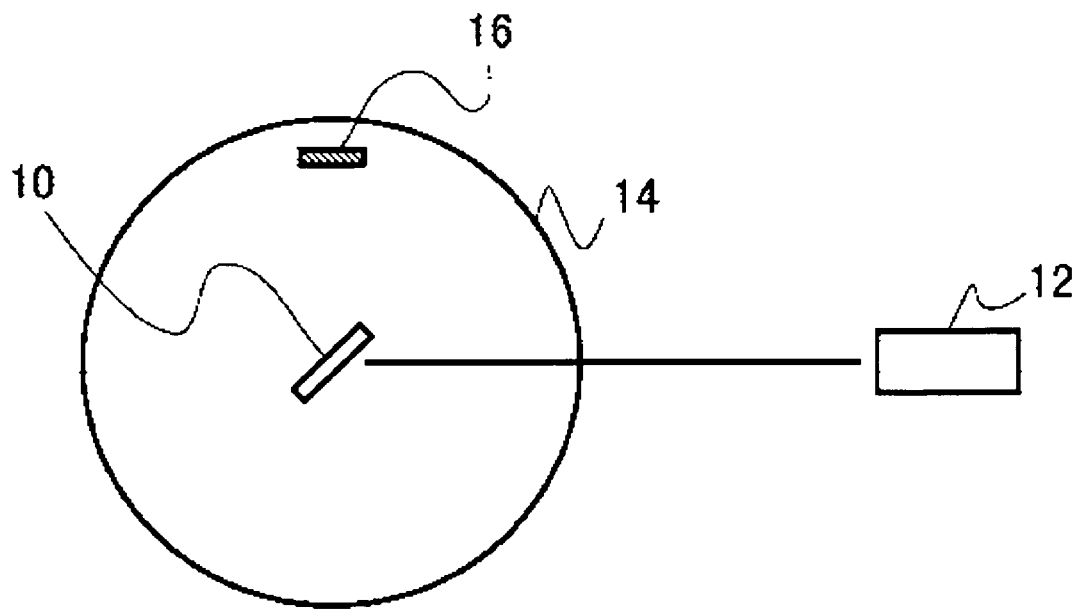
FIG. 3 is a schematic view explaining a method of measuring optical properties of a ceramics composite.

FIG. 3 is a schematic view explaining a method of measuring optical properties of a ceramics composite. After the resulting sintered article was processed into a sample having a prescribed form (□7.5 mm×0.08 mm (thickness t)), the emission intensity of a sample 10 was measured on an optical system shown in FIG. 3. In this regard, a blue LD (Laser Diode) 12 of 473 nm was used as an excitation light and, after an emitted light was collected at an integrating sphere 14, a spectrum was measured using a spectroscope 16 (USB4000 fiber multi-channel spectroscope manufactured by Ocean Optics, Inc.). The emission peak wavelength and emission intensity normalized with an absorption amount were calculated from the resulting spectrum.

The emission intensity was shown based on a measured result for a commercially available YAG:Ce phosphor (P46-Y3 manufactured by Chemical Optronics) being 100. Table 1 shows individual measured values of the emission peak wavelength and the emission intensity.

With regard to the emission peak wavelength, the case of 551 nm to less than 580 nm was evaluated as "Good", the case of 545 nm to less than 551 nm was evaluated as "Fair", and the case of less than 545 nm was evaluated as "Poor". Moreover, with regard to emission intensity, the case of more than 105 was evaluated as "Good", the case of 95 to 105 was evaluated as "Fair", and the case of less than 95 was evaluated as "Poor".

Figure 4:
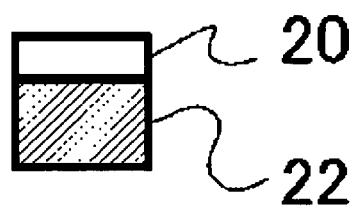
FIG. 4 is a layout view of a ceramics composite and a blue LED at the time when the ceramics composite is mounted on the blue LED and color unevenness is observed.

FIG. 4 is a layout view of a ceramics composite and a blue LED at the time when the ceramic composite is mounted on the blue LED and the color unevenness is observed. After the resulting sintered article was processed to a sample having a size of □1 mm×0.08 mm, it was fixed on a blue LED element (emission area: □1 mm, emission wavelength: at 460 nm) 22 with a silicone resin. On this occasion, the color unevenness was observed from a lateral side of the LED element and the measured results were classified into three stage of "Good", "Fair", and "Poor", the measured result for the commercially available YAG:Ce phosphor (P46-Y3 manufactured by Chemical Optronics) being taken as a standard ("Fair").

In the case where items ranked as "Good" are three or more among the items of the emission peak wavelength, emission intensity, color unevenness, and heat conductivity, overall evaluation was raked as "Good", in the case where "Poor" was present even for one item, overall evaluation was ranked as "Poor", and the other cases were classified as "Fair".

TABLE 1

| | Matrix phase | Phosphor phase | Content of phosphor phase in ceramics composite (% by volume) | Ce/Y atomic ratio | Emission peak wavelength | | Emission intensity | | Color unevenness | Heat conductivity (W/(m · K)) | Overall evaluation |
|---|---|---|---|---|---|---|---|---|---|---|---|
| Comparative Example 1 | $Al_2O_3$ | YAG: Ce | 20 | 0.001 | 539 | Poor | 107 | Good | Poor | 27 | Good | Poor |
| Comparative Example 2 | $Al_2O_3$ | YAG: Ce | 20 | 0.003 | 544 | Poor | 108 | Good | Poor | 27 | Good | Poor |
| Comparative Example 3 | $Al_2O_3$ | YAG: Ce | 20 | 0.005 | 553 | Good | 106 | Good | Poor | 26 | Good | Poor |
| Comparative Example 4 | $Al_2O_3$ | YAG: Ce | 20 | 0.008 | 554 | Good | 108 | Good | Poor | 26 | Good | Poor |
| Comparative Example 5 | $Al_2O_3$ | YAG: Ce | 20 | 0.01 | 555 | Good | 110 | Good | Poor | 26 | Good | Poor |
| Comparative Example 6 | $Al_2O_3$ | YAG: Ce | 20 | 0.02 | 561 | Good | 107 | Good | Poor | 26 | Good | Poor |
| Comparative Example 7 | $Al_2O_3$ | YAG: Ce | 20 | 0.035 | 561 | Good | 106 | Good | Poor | 26 | Good | Poor |
| Comparative Example 8 | $Al_2O_3$ | YAG: Ce | 20 | 0.05 | 561 | Good | 96 | Fair | Poor | 26 | Good | Poor |
| Comparative Example 9 | $Al_2O_3$ | YAG: Ce | 20 | 0.08 | 570 | Good | 94 | Poor | Poor | 25 | Good | Poor |
| Comparative Example 10 | $Al_2O_3$ | YAG: Ce | 22 | 0.001 | 540 | Poor | 108 | Good | Good | 23 | Good | Poor |
| Comparative Example 11 | $Al_2O_3$ | YAG: Ce | 22 | 0.003 | 545 | Fair | 107 | Good | Good | 24 | Good | Fair |
| Example 1 | $Al_2O_3$ | YAG: Ce | 22 | 0.005 | 554 | Good | 108 | Good | Good | 25 | Good | Good |
| Example 2 | $Al_2O_3$ | YAG: Ce | 22 | 0.008 | 555 | Good | 112 | Good | Good | 23 | Good | Good |
| Example 3 | $Al_2O_3$ | YAG: Ce | 22 | 0.01 | 556 | Good | 106 | Good | Good | 23 | Good | Good |
| Example 4 | $Al_2O_3$ | YAG: Ce | 22 | 0.02 | 560 | Good | 110 | Good | Good | 24 | Good | Good |

TABLE 1-continued

| | Matrix phase | Phosphor phase | Content of phosphor phase in ceramics composite (% by volume) | Ce/Y atomic ratio | Emission peak wavelength | | Emission intensity | | Color unevenness | Heat conductivity (W/(m·K)) | | Overall evaluation |
|---|---|---|---|---|---|---|---|---|---|---|---|---|
| Example 5 | $Al_2O_3$ | YAG: Ce | 22 | 0.035 | 561 | Good | 108 | Good | Good | 23 | Good | Good |
| Example 6 | $Al_2O_3$ | YAG: Ce | 22 | 0.05 | 563 | Good | 98 | Fair | Good | 24 | Good | Fair |
| Comparative Example 12 | $Al_2O_3$ | YAG: Ce | 22 | 0.08 | 570 | Good | 92 | Poor | Good | 24 | Good | Poor |
| Comparative Example 13 | $Al_2O_3$ | YAG: Ce | 30 | 0.001 | 541 | Poor | 109 | Good | Good | 23 | Good | Poor |
| Comparative Example 14 | $Al_2O_3$ | YAG: Ce | 30 | 0.003 | 543 | Poor | 108 | Good | Good | 23 | Good | Poor |
| Example 7 | $Al_2O_3$ | YAG: Ce | 30 | 0.005 | 552 | Good | 111 | Good | Good | 24 | Good | Good |
| Example 8 | $Al_2O_3$ | YAG: Ce | 30 | 0.008 | 554 | Good | 115 | Good | Good | 23 | Good | Good |
| Example 9 | $Al_2O_3$ | YAG: Ce | 30 | 0.01 | 557 | Good | 119 | Good | Good | 22 | Good | Good |
| Example 10 | $Al_2O_3$ | YAG: Ce | 30 | 0.02 | 561 | Good | 113 | Good | Good | 23 | Good | Good |
| Example 11 | $Al_2O_3$ | YAG: Ce | 30 | 0.035 | 562 | Good | 111 | Good | Good | 23 | Good | Good |
| Example 12 | $Al_2O_3$ | YAG: Ce | 30 | 0.05 | 564 | Good | 96 | Fair | Good | 23 | Good | Fair |
| Comparative Example 15 | $Al_2O_3$ | YAG: Ce | 30 | 0.08 | 571 | Good | 92 | Poor | Good | 23 | Good | Poor |
| Comparative Example 16 | $Al_2O_3$ | YAG: Ce | 40 | 0.001 | 538 | Poor | 109 | Good | Good | 21 | Good | Poor |
| Comparative Example 17 | $Al_2O_3$ | YAG: Ce | 40 | 0.003 | 542 | Poor | 107 | Good | Good | 22 | Good | Poor |
| Example 13 | $Al_2O_3$ | YAG: Ce | 40 | 0.005 | 551 | Good | 113 | Good | Good | 22 | Good | Good |
| Example 14 | $Al_2O_3$ | YAG: Ce | 40 | 0.008 | 552 | Good | 117 | Good | Good | 21 | Good | Good |
| Example 15 | $Al_2O_3$ | YAG: Ce | 40 | 0.01 | 554 | Good | 121 | Good | Good | 20 | Good | Good |
| Example 16 | $Al_2O_3$ | YAG: Ce | 40 | 0.02 | 557 | Good | 117 | Good | Good | 21 | Good | Good |
| Example 17 | $Al_2O_3$ | YAG: Ce | 40 | 0.035 | 562 | Good | 115 | Good | Good | 20 | Good | Good |
| Example 18 | $Al_2O_3$ | YAG: Ce | 40 | 0.05 | 564 | Good | 96 | Fair | Good | 21 | Good | Fair |
| Comparative Example 18 | $Al_2O_3$ | YAG: Ce | 40 | 0.08 | 571 | Good | 93 | Poor | Good | 21 | Good | Poor |
| Comparative Example 19 | $Al_2O_3$ | YAG: Ce | 55 | 0.001 | 538 | Poor | 108 | Good | Good | 19 | Fair | Poor |
| Comparative Example 20 | $Al_2O_3$ | YAG: Ce | 55 | 0.003 | 548 | Fair | 107 | Good | Good | 19 | Fair | Fair |
| Example 19 | $Al_2O_3$ | YAG: Ce | 55 | 0.005 | 552 | Good | 111 | Good | Good | 20 | Good | Good |
| Example 20 | $Al_2O_3$ | YAG: Ce | 55 | 0.008 | 553 | Good | 115 | Good | Good | 20 | Good | Good |
| Example 21 | $Al_2O_3$ | YAG: Ce | 55 | 0.01 | 554 | Good | 119 | Good | Good | 20 | Good | Good |
| Example 22 | $Al_2O_3$ | YAG: Ce | 55 | 0.02 | 557 | Good | 113 | Good | Good | 20 | Good | Good |
| Example 23 | $Al_2O_3$ | YAG: Ce | 55 | 0.035 | 561 | Good | 111 | Good | Good | 20 | Good | Good |
| Example 24 | $Al_2O_3$ | YAG: Ce | 55 | 0.05 | 562 | Good | 98 | Fair | Good | 18 | Fair | Fair |
| Comparative Example 21 | $Al_2O_3$ | YAG: Ce | 55 | 0.08 | 570 | Good | 94 | Poor | Good | 19 | Fair | Poor |
| Comparative Example 22 | $Al_2O_3$ | YAG: Ce | 60 | 0.001 | 539 | Poor | 104 | Fair | Good | 17 | Poor | Poor |
| Comparative Example 23 | $Al_2O_3$ | YAG: Ce | 60 | 0.003 | 548 | Fair | 103 | Fair | Good | 17 | Poor | Poor |
| Comparative Example 24 | $Al_2O_3$ | YAG: Ce | 60 | 0.005 | 551 | Good | 94 | Poor | Good | 17 | Poor | Poor |
| Comparative Example 25 | $Al_2O_3$ | YAG: Ce | 60 | 0.008 | 554 | Good | 96 | Fair | Good | 16 | Poor | Poor |
| Comparative Example 26 | $Al_2O_3$ | YAG: Ce | 60 | 0.01 | 555 | Good | 98 | Fair | Good | 16 | Poor | Poor |
| Comparative Example 27 | $Al_2O_3$ | YAG: Ce | 60 | 0.02 | 557 | Good | 97 | Fair | Good | 16 | Poor | Poor |
| Comparative Example 28 | $Al_2O_3$ | YAG: Ce | 60 | 0.035 | 561 | Good | 94 | Poor | Good | 16 | Poor | Poor |
| Comparative Example 29 | $Al_2O_3$ | YAG: Ce | 60 | 0.05 | 562 | Good | 92 | Poor | Good | 16 | Poor | Poor |
| Comparative Example 30 | $Al_2O_3$ | YAG: Ce | 60 | 0.08 | 571 | Good | 89 | Poor | Good | 16 | Poor | Poor |

As shown in Table 1, it is recognized that further improvement of the emission intensity and heat conductivity can be achieved as a ceramics composite and extension of the life of an light emitting diode using the same can be achieved when the content of the phosphor phase in the ceramics composite is 22% by volume to 55% by volume and the content of Ce in the YAG is 0.005 to 0.05 in terms of an atomic ratio of Ce to Y (Ce/Y). Furthermore, it is recognized that a ceramics composite for wavelength conversion exhibiting higher emission intensity can be obtained by controlling the content of Ce in the YAG to 0.005 to 0.035 in terms of an atomic ratio of Ce to Y (Ce/Y).

(Test 2)

For the sintered article in Test 1, the emission peak wavelength (nm), emission intensity, color unevenness, and heat conductivity were evaluated in the same manner as in Test 1 except that the thickness t in the light outgoing direction was changed within the range where a white light was obtained. On this occasion, evaluation was performed for the samples (Examples 1, 3, and 5) in which the content of the phosphor phase 5 was 22% by volume, which had a possibility that the color unevenness might occur due to a small content of the phosphor phase 5.

The results are shown in Table 2. In Table 2, the emission peak wavelength (nm), emission intensity, color unevenness, and heat conductivity are not described since they are the same level as in Examples 1, 3, and 5.

TABLE 2

| | Matrix phase | Phosphor phase | Content of phosphor phase in ceramics composite (% by volume) | Ce/Y atomic ratio | Thickness t in light outgoing direction (μm) | Color unevenness |
|---|---|---|---|---|---|---|
| Comparative Example 31 | $Al_2O_3$ | YAG: Ce | 22 | 0.005 | 20 | Poor |
| Example 25 | $Al_2O_3$ | YAG: Ce | 22 | 0.005 | 30 | Good |
| Example 26 | $Al_2O_3$ | YAG: Ce | 22 | 0.005 | 150 | Good |
| Example 27 | $Al_2O_3$ | YAG: Ce | 22 | 0.005 | 200 | Good |
| Comparative Example 32 | $Al_2O_3$ | YAG: Ce | 22 | 0.005 | 250 | Poor |
| Comparative Example 33 | $Al_2O_3$ | YAG: Ce | 22 | 0.005 | 300 | Poor |
| Comparative Example 34 | $Al_2O_3$ | YAG: Ce | 22 | 0.01 | 20 | Poor |
| Example 28 | $Al_2O_3$ | YAG: Ce | 22 | 0.01 | 30 | Good |
| Example 29 | $Al_2O_3$ | YAG: Ce | 22 | 0.01 | 150 | Good |
| Example 30 | $Al_2O_3$ | YAG: Ce | 22 | 0.01 | 200 | Good |
| Comparative Example 35 | $Al_2O_3$ | YAG: Ce | 22 | 0.01 | 250 | Poor |
| Comparative Example 36 | $Al_2O_3$ | YAG: Ce | 22 | 0.01 | 300 | Poor |
| Comparative Example 37 | $Al_2O_3$ | YAG: Ce | 22 | 0.035 | 20 | Poor |
| Example 31 | $Al_2O_3$ | YAG: Ce | 22 | 0.035 | 30 | Good |
| Example 32 | $Al_2O_3$ | YAG: Ce | 22 | 0.035 | 150 | Good |
| Example 33 | $Al_2O_3$ | YAG: Ce | 22 | 0.035 | 200 | Good |
| Comparative Example 38 | $Al_2O_3$ | YAG: Ce | 22 | 0.035 | 250 | Poor |
| Comparative Example 39 | $Al_2O_3$ | YAG: Ce | 22 | 0.035 | 300 | Poor |

As shown in Table 2, it is recognized that further improvement of the emission intensity and heat conductivity as a ceramics composite can be achieved and extension of the life of an light emitting diode using the same can be achieved in the case where the thickness in the light outgoing direction is 30 μm to 200 μm.

Moreover, in Examples in Tables 1 and 2, it was confirmed that the emission intensity was further improved when the particle size of the YAG particles containing Ce constituting the phosphor phase was 0.5, 2.6, 5.8, and 10.0 in the case where the particle size was set with being changed into 0.4, 0.5, 2.6, 5.8, 10.0, and 15.0.

Furthermore, in Examples in Tables 1 and 2, it was confirmed that the emission intensity was further improved when the surface roughness (Ra) on the outgoing surface was 0.1, 0.4, and 1.0 in the case where the surface roughness was set with being changed into 0.06, 0.1, 0.4, 1.0, and 1.5.

While the invention has been described in detail with reference to specific embodiments thereof, it will be apparent to one skilled in the art that various changes and modifications can be made therein without departing from the spirit and scope thereof.

Incidentally, the present application is based on Japanese Patent Applications No. 2010-182894 filed on Aug. 18, 2010 and No. 2011-081113 filed on Mar. 31, 2011, and the contents are incorporated herein by reference.

All references cited herein are incorporated by reference herein in their entirety.

Also, all the references cited herein are incorporated as a whole.

DESCRIPTION OF REFERENCE NUMERALS AND SIGNS

10 Sample
12 Blue LD
14 Integrated sphere
16 Spectroscope
20 Sample
22 Blue LED element

What is claimed is:

1. A ceramics composite comprising an inorganic material which comprises:
   a matrix phase comprising translucent ceramics; and
   a phosphor phase comprising YAG containing Ce,
   wherein a content of the phosphor phase is from 22% by volume to 55% by volume based on a whole phase including the matrix phase and the phosphor phase,
   wherein a content of Ce in the YAG is 0.005 to 0.05 in terms of an atomic ratio of Ce to Y (Ce/Y), and
   wherein the ceramics composite has a thickness in a light outgoing direction of 30 μm to 200 μm.

2. The ceramics composite according to claim 1, wherein the content of Ce in the YAG is 0.005 to 0.035 in said terms of the atomic ratio of Ce to Y (Ce/Y).

3. The ceramics composite according to claim 1, wherein the ceramics composite has an emission peak wavelength of 551 nm to 580 nm at a time when a blue light enters into the ceramics composite.

4. The ceramics composite according to claim 2, wherein the ceramics composite has an emission peak wavelength of 551 nm to 580 nm at a time when a blue light enters into the ceramics composite.

5. The ceramics composite according to claim 1, wherein the matrix phase comprises $Al_2O_3$.

6. The ceramics composite according to claim 1, wherein an average crystal particle size of particles of YAG containing Ce constituting the phosphor phase is 0.5 μm to 10.0 μm, and wherein a surface roughness (Ra) on a light outgoing surface of the ceramics composite is 0.1 μm to 1.0 μm.

7. The ceramics composite according to claim 2, wherein an average crystal particle size of particles of YAG containing Ce constituting the phosphor phase is 0.5 μm to 10.0 μm, and wherein a surface roughness (Ra) on a light outgoing surface of the ceramics composite is 0.1 μm to 1.0 μm.

8. The ceramics composite according to claim 3, wherein an average crystal particle size of particles of YAG containing Ce constituting the phosphor phase is 0.5 μm to 10.0 μm, and wherein a surface roughness (Ra) on a light outgoing surface of the ceramics composite is 0.1 μm to 1.0 μm.

9. The ceramics composite according to claim 4, wherein an average crystal particle size of particles of YAG containing Ce constituting the phosphor phase is 0.5 μm to 10.0 μm, and wherein a surface roughness (Ra) on a light outgoing surface of the ceramics composite is 0.1 μm to 1.0 μm.

10. The ceramics composite according to claim 5, wherein an average crystal particle size of particles of YAG containing Ce constituting the phosphor phase is 0.5 μm to 10.0 μm, and wherein a surface roughness (Ra) on a light outgoing surface of the ceramics composite is 0.1 μm to 1.0 μm.

\* \* \* \* \*